(12) United States Patent
Verdant

(10) Patent No.: US 10,461,726 B2
(45) Date of Patent: Oct. 29, 2019

(54) COMPENSATED COMPARATOR

(71) Applicant: COMMISSARIAT A L'ENERGIE ATOMIQUE ET AUX ENERGIES ALTERNATIVES, Paris (FR)

(72) Inventor: Arnaud Verdant, Saint Nazaire les Eymes (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/236,723

(22) Filed: Dec. 31, 2018

(65) Prior Publication Data

US 2019/0214977 A1    Jul. 11, 2019

(30) Foreign Application Priority Data

Jan. 4, 2018  (FR) .................................... 18 50031

(51) Int. Cl.
  *H03K 5/22*    (2006.01)
  *H03K 5/24*    (2006.01)
  *H03K 5/15*    (2006.01)

(52) U.S. Cl.
  CPC ......... *H03K 5/2481* (2013.01); *H03K 5/1506* (2013.01)

(58) Field of Classification Search
  CPC ............................ H03K 5/2481; H03K 5/1506
  See application file for complete search history.

(56) References Cited

U.S. PATENT DOCUMENTS

| 4,611,130 | A | * | 9/1986 | Swanson | ................ | H03K 5/249 |
| | | | | | | 327/52 |
| 5,684,485 | A | | 11/1997 | Paillardet et al. | | |
| 7,423,676 | B2 | * | 9/2008 | Barna | .................. | H04N 5/3598 |
| | | | | | | 348/241 |
| 8,797,205 | B2 | * | 8/2014 | Furuta | .................. | H03M 1/164 |
| | | | | | | 341/155 |

(Continued)

FOREIGN PATENT DOCUMENTS

| EP | 0 695 035 A1 | 1/1996 |
| WO | WO 03/014913 A2 | 2/2003 |
| WO | WO2017/089596 A1 | 6/2017 |

OTHER PUBLICATIONS

French Search Report dated Oct. 18, 2018 in French Application 18 50031 filed on Jan. 4, 2018 (with English Translation of Categories of Cited Documents).

(Continued)

*Primary Examiner* — Kenneth B Wells
(74) *Attorney, Agent, or Firm* — Oblon, McClelland, Maier & Neustadt, L.L.P.

(57) ABSTRACT

A compensated comparator is provided, including a decision stage and a differential stage provided with two transistors connected by their sources, the differential stage being provided with compensation means to compensate the effects of a dispersion of the threshold voltages of the transistors forming the differential stage, the compensation means including first and second capacitors each connected to a gate of one of the two transistors, and being configured to memorize a voltage that is a function of a threshold voltage of the considered transistors.

14 Claims, 5 Drawing Sheets

(56) References Cited

U.S. PATENT DOCUMENTS

| | | | |
|---|---|---|---|
| 8,810,282 B2* | 8/2014 | Li | H03G 3/00 |
| | | | 327/54 |
| 9,197,198 B2* | 11/2015 | Rajaee | H03K 3/0375 |
| 9,455,695 B2* | 9/2016 | Kull | H03K 5/249 |
| 9,860,468 B2* | 1/2018 | Nishimura | H03M 1/12 |

OTHER PUBLICATIONS

Masaya Miyahara, et al., "A Low-Noise Self-Calibrating Dynamic Comparator for High-Speed ADCs", 10.1109/ASSCC.2008. 4708780. 2008, 4 pages.

Ji Cui, et al., "A Dynamic Latched Comparator With Built-In Offset Calibration", Far East Journal of Electronics and Communications, vol. 14. No. 2., http://dx.doi.org/10.17654/FJECJun2015_105_115., 2015, 12 pages.

* cited by examiner

COMPENSATED COMPARATOR

TECHNICAL FIELD

The present invention relates to a comparator. In particular, the present invention relates to a compensated comparator that comprises a differential stage provided with two transistors.

PRIOR ART

A comparator 10 known from the prior art and illustrated in FIG. 1 comprises:
- a decision stage 20 intended to deliver an output signal representative of the comparison of a first $V_{in1}$ and a second $V_{in2}$ input potential imposed, respectively, on a first 31 and on a second 32 input terminal of the comparator;
- a differential stage 30 comprising identical first M1 and second M2 transistors, connected by their sources in a node S, and connected by their respective drains to the decision stage, and of which the gates form respectively, the first 31 and the second 32 input terminals of the comparator.

The decision stage 20 may, for example, comprise two CMOS inverters 21, 22 (hereafter "inverter") mounted in counter-reaction. In particular, each inverter 21, 22 comprises a NMOS transistor M3, M4 and a PMOS transistor M5, M6 connected by their drains in the Out−, Out+ points forming the outputs of the comparator 10.

In operation, an output signal can switch over either to a first state or to a second state as a function of the sign of the potential difference $V_{in1} - V_{in2}$.

However, such a comparator known from the prior art is not satisfactory.

Indeed, the characteristics of the comparator 10, and in particular the threshold voltages of the transistors M1 and M2, which are sensitive to technological dispersions and notably to the error of etching the channels of said transistors, may vary from one comparator to the next.

Thus, a significant dispersion of the order of 50 mV (±3σ) of the trip point of the output signal is observed from one comparator to the next.

In order to overcome this problem, the documents [1] and [2] cited at the end of the description propose carrying out a calibration of the comparator. However the methods and layouts proposed in these documents generate additional power consumption which is not desirable, notably when the comparator is integrated in an image sensor.

Thus, an aim of the present invention is to propose a layout making it possible to reduce the dispersion of the trip point from one comparator to the next and for which the power consumption is low.

DESCRIPTION OF THE INVENTION

The aim of the present invention is, at least in part, attained by a compensated comparator comprising:
- first and second inputs intended to receive respectively first $V_{in1}$ and second $V_{in2}$ potentials to be compared;
- a differential stage provided with first and second transistors of same type, connected by their sources in a node S and each comprising a gate called, respectively, first and second gate,
- a decision stage connected to the drains of the first and second transistors and delivering a comparison signal on an output of the comparator;

characterised in that it comprises
- first and second capacitors intercalated, respectively, between the first gate and the first input and between the second gate and the second input;
- first and second decision switches placed between the decision stage and the drains of the first and second transistors of the differential stage;
- pre-charge, sharing, and decision devices commanded by a control circuit, to implement successive pre-charge, sharing and decision phases;
- the pre-charge device making it possible to impose a charge on the first and second capacitors such that a pre-charge voltage is present at the terminals of the capacitors at the end of the pre-charge phase,
- the sharing device making it possible to short circuit the gate and the drain of each of the first and second transistors, the short circuits causing a charge transfer from the first and second capacitors to the node S, the transfer being interrupted from the moment that the gate-source voltages of the first and second transistors become lower than the respective threshold voltages of the first and second transistors, and
- the decision device making it possible to switch on said decision switches to make the comparison between the first and second input potentials applied on the first and second input terminals.

According to one embodiment, the pre-charge device comprises first and second charge switches connecting the first and second inputs to an earth potential when they are made conductive on command of a first pre-charge signal, and also comprises third and fourth charge switches, connecting the first and second gates to a supply voltage, when they are made conductive on command of a second pre-charge signal, the first and second pre-charge signals being advantageously concomitant.

According to one embodiment, the sharing device comprises first and second sharing switches commanded and intended to short circuit the gate and the drain of each of the first and second transistors on command of a sharing signal, the third and fourth charge switches being non-conductive during the sharing phase.

According to one embodiment, the decision device comprises first and second input switches commanded and intended to apply the first $V_{in1}$ and second $V_{in2}$ input potentials on the first and second inputs on command of a decision signal, said decision signal also commanding the closing of the first and second decision switches so as to enable the passage of a current through the differential stage and the decision stage, the sharing switches and the charge switches being non-conductive during the decision phase.

According to one embodiment, the decision stage and the differential stage are placed in series between earth and a supply voltage, the node S of the differential stage being connected to earth, either directly, or through an activation transistor, the activation transistor being made conductive during the decision phase.

According to one embodiment, the node S of the differential stage is connected to earth through an activation transistor and in which a third capacitor is placed between earth and a third sharing switch furthermore connected to the node S, a reset switch being placed in parallel with the third capacitor, the third capacitor being discharged by making the reset switch conductive during the pre-charge phase, the third capacitor being connected to the node S by making the third sharing switch (CP3) conductive during the sharing phase.

According to one embodiment, the activation transistor is made conductive during the charge sharing phase to enable the transfer of charges from the first and second gates to the point S.

According to one embodiment, the comparator further comprises first and second input switches respectively connected to the first and second inputs and commanded to be made conductive during the decision phase.

According to one embodiment, the comparator further comprises a reference voltage generator intended to impose the second input potential $V_{in2}$.

According to one embodiment, the reference voltage generator comprises a fourth capacitor placed between earth and a node B as well as a fifth capacitor placed between earth and a point C, a switch being placed in parallel with the capacitor between the node B and earth, a switch being placed between the node B and a point C, a switch being placed between the point C and the supply voltage Vdd, the switch being placed between the node B and the input In2, the switches being commanded to:

during the pre-charge phase, charge the capacitor to the voltage Vdd and discharge the capacitor;
during the sharing phase, share the charges between the capacitors, in order to obtain a reference voltage at the terminals of the capacitors; and
during the decision phase, make the switch conductive to apply the reference voltage on the second input.

According to one embodiment, the comparator is a dynamic logic comparator.

According to one embodiment, the decision stage comprises two inverters, called, respectively, first inverter and second inverter, mounted in counter-reaction.

According to one embodiment, the sources of the NMOS transistors of the first and second inverters are connected, respectively, to the drains of the first and second transistors.

The invention also relates to an imager comprising at least one comparator according to the present invention.

BRIEF DESCRIPTION OF THE DRAWINGS

Other characteristics and advantages will become clear from the description that follows of the compensated comparator according to the invention, given as non-limiting examples, with reference to the appended drawings in which:

FIG. 3 represents the state of the compensator during the pre-charge phase;

FIG. 4 represents the state of the compensator during the sharing phase;

FIG. 5 represents the state of the compensator during the decision phase.

DETAILED DESCRIPTION OF PARTICULAR EMBODIMENTS

Figure 1:
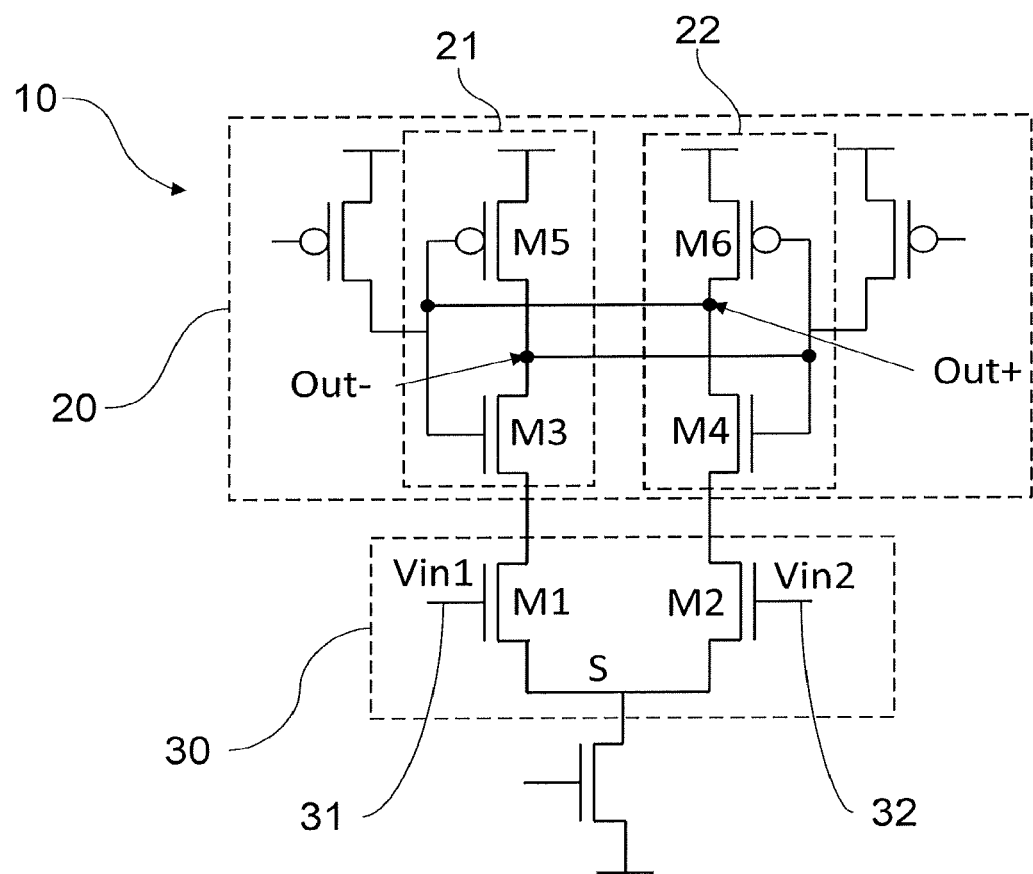
FIG. 1 is a schematic representation of a comparator, more specifically a dynamic comparator, known from the prior art.

The present invention relates to a compensated comparator. Notably, the present invention relates to a comparator that comprises a decision stage and a differential stage provided with two transistors connected by their source.

The differential stage is provided with compensation means intended to compensate the effects of a dispersion of the threshold voltages of the transistors forming the differential stage.

Notably, the compensation means comprise first and second capacitors, each placed between a gate of one of the two transistors and one of the two inputs of the comparator. As will be detailed hereafter, the capacitors make it possible in an initial phase, of pre-decision, to "memorise" a voltage at their terminals which is a function of the threshold voltage of the associated transistor (and which takes account of its potential shift compared to a nominal value). In a decision phase, the potentials to compare are applied on the inputs of the comparator and are next transmitted onto the gates of the transistors, with a voltage shift corresponding to the voltages memorised in the capacitors.

In FIGS. 2 to 5, an example of compensated comparator 100 according to one embodiment of the present invention can be seen.

The compensated comparator 100 comprises a decision stage 200, a differential stage 300 and an activation stage (represented in this example by an activation transistor 500), all three placed in series between a supply voltage Vdd and earth.

The comparator 100 is intended to compare a first potential $V_{in1}$ and a second potential $V_{in2}$, imposed respectively on a first input In1 and a second input In2 of the compensated comparator 100.

The comparator represented in FIGS. 2 to 5 is a comparator produced in dynamic logic, with a control circuit, not represented, operating with a pre-charge phase and an evaluation (or decision) phase. Such a comparator is particularly suited to low consumption operation.

The decision stage 200 comprises two CMOS inverters mounted in counter-reaction and called, respectively, first inverter 210 and second inverter 220. These two inverters are placed between a supply voltage Vdd and the differential stage.

In particular, the first inverter 210 comprises a NMOS transistor M3 and a PMOS transistor M5 having their drains connected in a node 203, the source of the transistor M3 forming a first input terminal 201 of the decision stage 200. In an equivalent manner, the second inverter 220 comprises a NMOS transistor M4 and a PMOS transistor M6 having their drains connected in a node 204, the source of the transistor M4 forming a second input terminal 202 of the decision stage 200.

The decision stage 200 further comprises two pre-charge transistors 205 and 206 respectively connected to the inputs of the inverters, that is to say to the nodes 204 and 203.

The differential stage 300 comprises two transistors of same type, a first transistor M1 and a second transistor M2 having their sources connected in a node 5, and each provided with a gate called, respectively, first gate G1 and second gate G2.

The first M1 and second M2 transistors, of respective threshold voltages $V_{th1}$ and $V_{th2}$, are of the same type, either of p-type (called PMOS transistor) or of n-type (called NMOS transistor).

In the remainder of the text, the first M1 and second M2 transistors are considered as being of n-type (NMOS).

Like any comparator operating in dynamic logic with a pre-charge phase and an evaluation (or decision) phase, the pre-charge transistors 205 and 206 are made conductive during the pre-charge phase and the evaluation transistor

500 is for its part made conductive in the decision phase. Thus, during the pre-charge phase, the two inputs of the inverters are maintained at the supply voltage Vdd, and no current passes through the stages in series because the activation transistor 500 is non-conductive, the static consumption being very low. During the decision phase, the pre-charge transistors 205 and 206 are non-conductive and the activation transistor 500 is made conductive, which induces a circulation of current through the series of stages. The currents passing through the transistors M1 and M2 are a function of the voltages on their gates and the two inverters 210 and 220 "trip over" in one sense or in another leading to a low voltage (close to earth) on the point 203 and a high voltage (Vdd) on the point 204 or conversely. Once the trip over realised, the decision taken may be noted by an external device, not represented, connected to one or more outputs of the comparator corresponding to the points 203 and 204.

Generally speaking, "commanded switch" is taken to mean a switch which, under the effect of a suitable signal, switches between two states called, respectively, on and off. A commanded switch may comprise an n- or p-type transistor switching between an on state and an off state as a function of its gate potential.

According to one aspect of the present invention, the compensated comparator 100 also comprises a first capacitor C1 and a second capacitor C2 intercalated, respectively, between the first gate G1 and the first input In1 and between the second gate G2 and the second input In2.

The compensated comparator 100 also comprises a pre-charge device MCi, a charge sharing device MPi, and a decision device MDi intended to be implemented, respectively, during successive pre-charge, sharing and decision phases.

Generally speaking, the pre-charge device MCi, the charge sharing device MPi and the decision device MDi all three correspond to a particular layout, notably a layout of commanded switches, and implemented during different successive pre-charge, sharing and decision phases.

Figure 3:
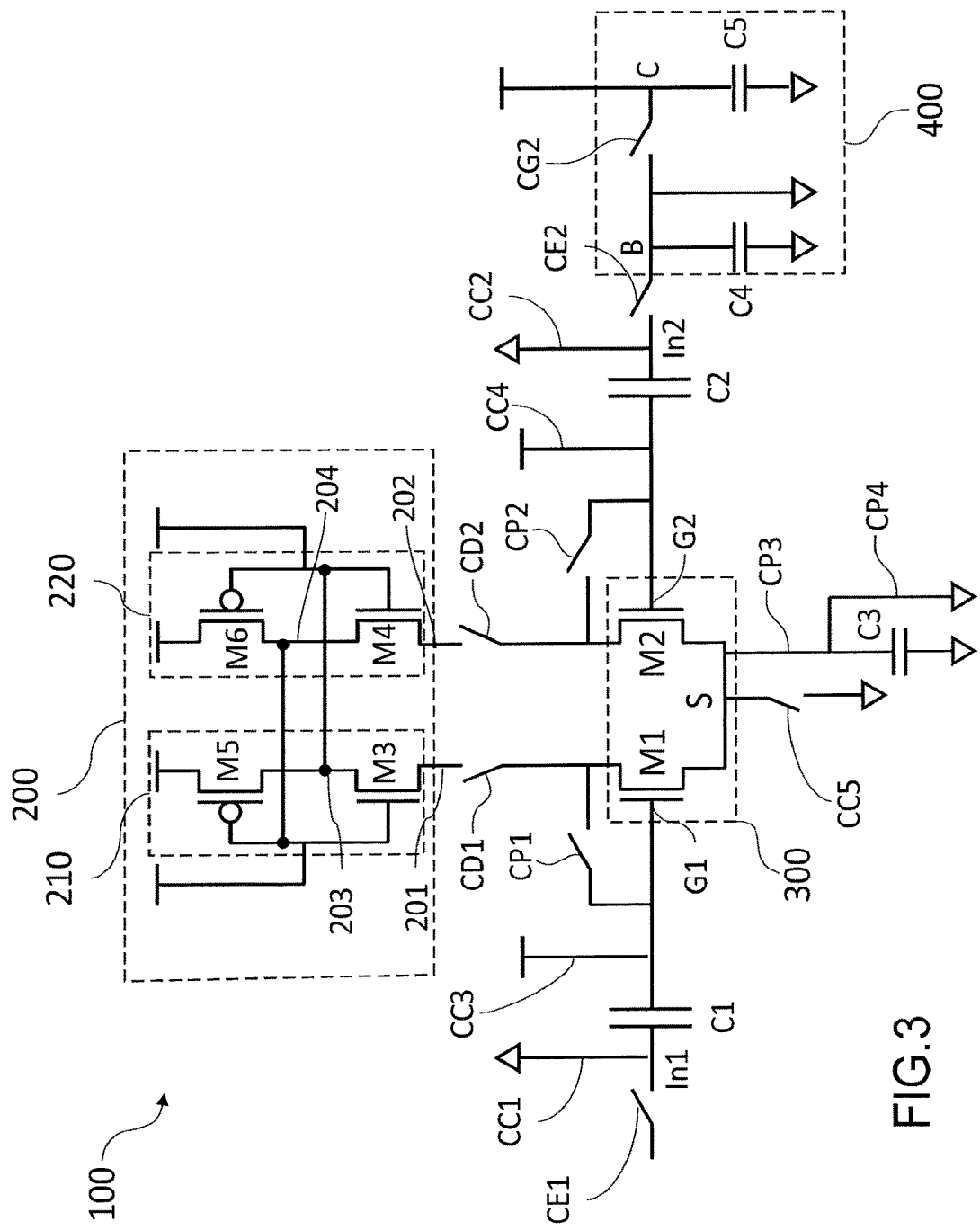
FIG. 3 is a schematic representation of the compensated comparator reproducing all the elements of the comparator of FIG. 2, in particular.
Figure 4:
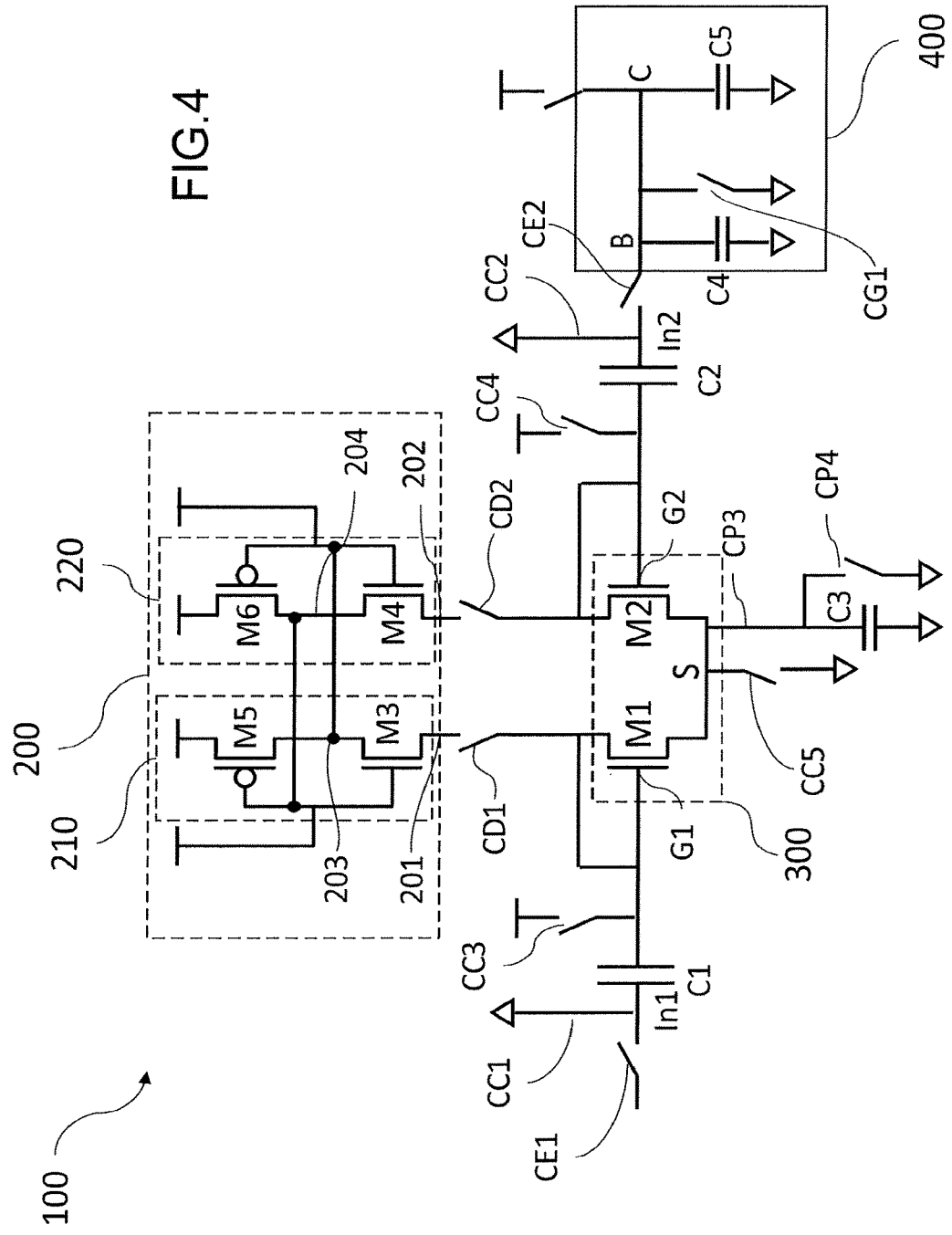
FIG. 4 is a schematic representation of the compensated comparator reproducing all the elements of the comparator of FIG. 2, in particular.
Figure 5:
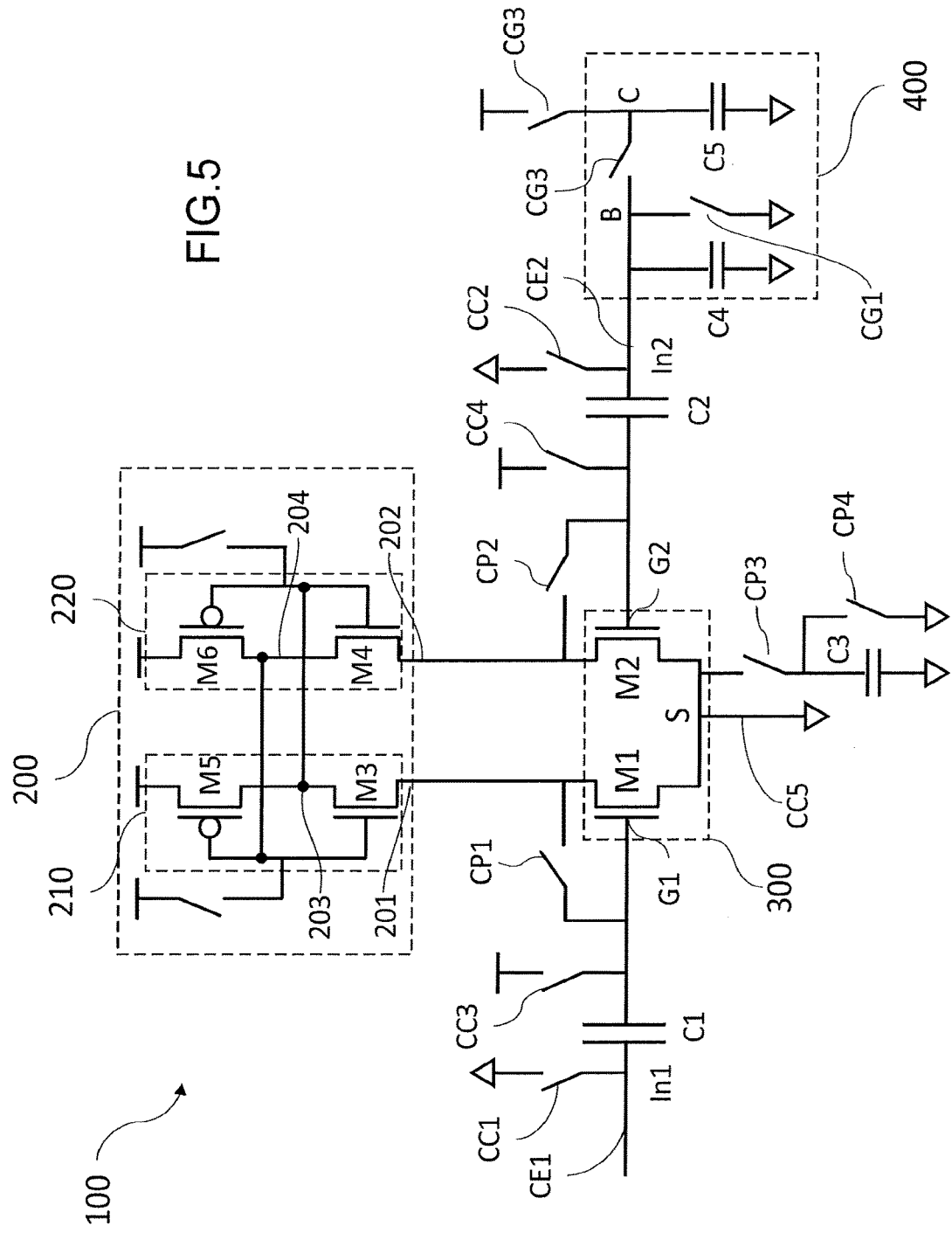
FIG. 5 is a schematic representation of the compensated comparator reproducing all the elements of the comparator of FIG. 2, in particular.

In this respect, FIGS. 3, 4 and 5 correspond to three switching states of the layout of commanded switches. Notably, FIGS. 3, 4 and 5 illustrate the role of the layout of commanded switches during, respectively, pre-charge, sharing and decision phases.

The different devices (pre-charge, sharing, decision) are commanded by a control circuit, not represented, which commands all of the switches present in these devices. The control circuit uses for example a clock signal to give rhythm to the different phases of its operation.

During the initial phases, preceding the decision step, the decision stage and the differential stage are isolated so as not to perturb the operation of the pre-charge and sharing devices described in greater detail hereafter. Thus, the drains of the transistors M1 and M2 of the differential stage are connected to the input terminals 201 and 202 of the decision stage 200 by switches CD1 and CD2. These switches CD1 and CD2 are made conductive uniquely during the decision phase.

The pre-charge device MCi makes it possible to charge the first capacitor C1 and the second capacitor C2 so as to have a pre-charge voltage Vprech at the terminals of each capacitor at the end of the pre-charge phase.

The pre-charge device MCi comprises a first charge switch CC1 and a second charge switch CC2 making it possible to connect to an earth potential, respectively the first input In1 and the second input In2.

The pre-charge device MCi also comprises a third charge switch CC3 and a fourth charge switch CC4 making it possible to connect the voltage source Vdd, respectively to the first gate G1 and to the second gate G2.

The first CC1, second CC2, third CC3 and fourth CC4 charge switches are commanded by the control circuit to be on during the pre-charge phase.

The first charge switch CC1 and the second charge switch CC2 switch to an on state, at the start of the pre-charge phase, under the effect of a first charge signal, so as to impose an earth potential at the level of the first input In1 and the second input In2.

The third charge switch CC3 and the fourth charge switch CC4 switch to an on state at the start of the pre-charge phase under the effect of a second charge signal, so as to impose the potential Vdd, respectively on the first gate G1 and on the second gate G2.

The first charge signal and the second charge signal may be concomitant.

At the end of the pre-charge phase, the voltage Vprech at the terminals of each of the first C1 and second C2 capacitors is in this example equal to the voltage Vdd. The pre-charge voltage Vprech of the capacitors could be different from Vdd. Its value must be sufficient to make it possible to carry out the next step.

The pre-charge phase is then followed by a sharing phase that implements the sharing device MPi.

The sharing device MPi is provided to short circuit the first gate G1 with the drain of the first transistor M1, and the second gate G2 with the drain of the second transistor M2.

The first transistor M1 and the second transistor M2 are initially conductive and a transfer of charges takes place between the first capacitor C1 and the source S on the one hand, and between the second capacitor C2 and the source S on the other hand. This transfer of charges results from the flow of charges from the capacitors C1 and C2 through the channels of the on transistors M1 and M2 to the node S of lowest potential. This decreasing variation in the potential, respectively, on the first gate G1 and the second gate G2 ends up in the switching from an on state to an off state of the first M1 and second M2 transistors.

In order that this flow of charges is possible, it is necessary at the start of the sharing phase that the potential of the node S is sufficiently low so that the transistors M1 and M2 are conductive. In other words, the gate-source voltage (Vg1s and Vg2s) of the transistors M1 and M2 has to be above the respective threshold voltages of the transistors. If Vs designates the voltage at the node S, during the sharing phase the following relationships exist between the voltages: Vs+Vg1s=V1 and Vs+Vg2s=V2, with V1 and V2 the voltages respectively at the terminals of the capacitors C1 and C2. The voltage Vs can vary or not during the sharing phase according to the embodiments. Whatever the case, the initial voltage Vsi at the node S and the initial voltages V1i and V2i are such that V1i−Vsi>Vth1 and V2i−Vsi>Vth2. After flow of the charges, the transistors M1 and M2 are blocked and the voltages at the terminals of the capacitors are then substantially the following: Vsf+Vth1=V1 and Vsf+Vth2=V2, with Vsf equal to the final voltage at the node S after sharing of the charges (Vsf being able to be equal to or different to Vsi according to the embodiment). Thus, if the threshold voltages of the transistors differ, the voltages at the terminals of the capacitors are also different at the end of the sharing phase, prior to the decision phase.

According to one embodiment, the charge device MCi comprises a fifth charge switch CC5 commanded, from the moment that it is on, to connect the source S to the earth potential during the pre-charge and sharing phases. The function of the charge switches CC5 may potentially be realised by the switch 500.

According to one embodiment, the sharing device MPi comprises a first sharing switch CP1 and a second sharing switch CP2 making it possible to short circuit the gate and the drain, respectively, of the first transistor M1 and the second transistor M2 during the sharing phase. The switches CP1 and CP2 are preferably non-conductive during the pre-charge phase (of the capacitors C1 and C2) to avoid any needless energy consumption and to enable a rapid charge of the capacitors C1 and C2. The switches CP1 and CP2 are non-conductive during the decision phase.

The first sharing switch CP1 and the second sharing switch CP2 switch to an on state at the start of the sharing phase under the effect of a sharing signal so as to short circuit the gate and the drain, respectively, of the first transistor M1 and of the second transistor M2.

A command signal, concomitant with the sharing signal, or preceding the sharing signal, commands the switching to an off state of the third charge switch CC3 and of the fourth charge switch CC4, in order not to perturb the flow of charges.

During the sharing phase, the first charge switch CC1 and the second charge switch CC2 are maintained in an on state in order to enable a discharge of the capacitors C1 and C2 until the transistors M1 and M2 are non-conductive.

According to a first alternative, the source S is maintained at the earth potential throughout the duration of the sharing phase.

According to a second alternative, the sharing device MPi further comprises a third capacitor C3 intercalated between earth and the node S. A third sharing switch CP3 is intercalated between the node S and the capacitor C3. A fourth reset switch CP4 is placed in parallel with the capacitor C3, between earth and the connection point of the switch CP3 and the capacitor C3. During the pre-charge phase, the capacitor C3 is reset by making the switch CP4 conductive (CP4 being non-conductive during other phases). During the sharing phase, the switch CP3 is made conductive, such that the sharing of charges takes place between the first capacitor C1 and the third capacitor C3 on the one hand, and the second capacitor C2 and the third capacitor C3 on the other hand.

The sharing phase is followed by the decision phase during which the decision stage delivers an output signal which is a function of the input potentials $V_{in1}$ and $V_{in2}$ imposed, respectively, on the first input In1 and on the second input In2.

According to one embodiment, a first input switch CE1 and a second input switch CE2 are respectively connected to the first input In1 and to the second input In2. During the decision phase, the switches CE1 and CE2 are switched on and first $V_{in1}$ and second $V_{in2}$ input potentials are applied on the inputs In1 and In2.

Moreover, during the decision phase, the first decision switch CD1 and the second decision switch CD2 are made conductive, as well as the activation transistor 500. The 3 stages in series (decision 200, differential 300 and activation 500) are activated, and a current circulates between the supply voltage and earth through the inverters 210, 220, the transistors M1, M2 and the transistor 500. This decision phase corresponds to the phase of evaluation of a comparator in dynamic logic as explained previously. The output potentials 203 and 204 are established as a function of the potentials present on the gates G1 and G2.

In the comparator according to the present invention, the voltages applied on the gates G1 and G2 during the decision phase are not directly the voltages Vin1 and Vin2 that it is wished to compare. Indeed, following the two prior phases of pre-charge and sharing, the capacitors C1 and C2 are charged and have voltages at their terminals respectively of Vsf1+Vth1=V1 and Vsf+Vth2=V2 as described previously. At the moment when the voltage Vin1 is applied on the input In1, the input In1 passes from a substantially zero potential (because input In1 previously connected to earth) to the voltage Vin1. Thereafter, the potential on the gate G1 is also shifted and passes from Vsf+Vth1 to Vsf+Vth1+Vin1. Similarly, the potential on the gate G2 is also shifted and passes from Vsf+Vth2 to Vsf+Vth2+Vin2.

The potential of the node S is substantially zero during the decision phase, when the switch 500 is made conductive. Thus, the voltages Vg1$s$ and Vg2$s$ are defined by: Vg1$s$=Vsf+Vth1+Vin1 and Vg2$s$=Vsf+Vth2+Vin2.

Figure 2:
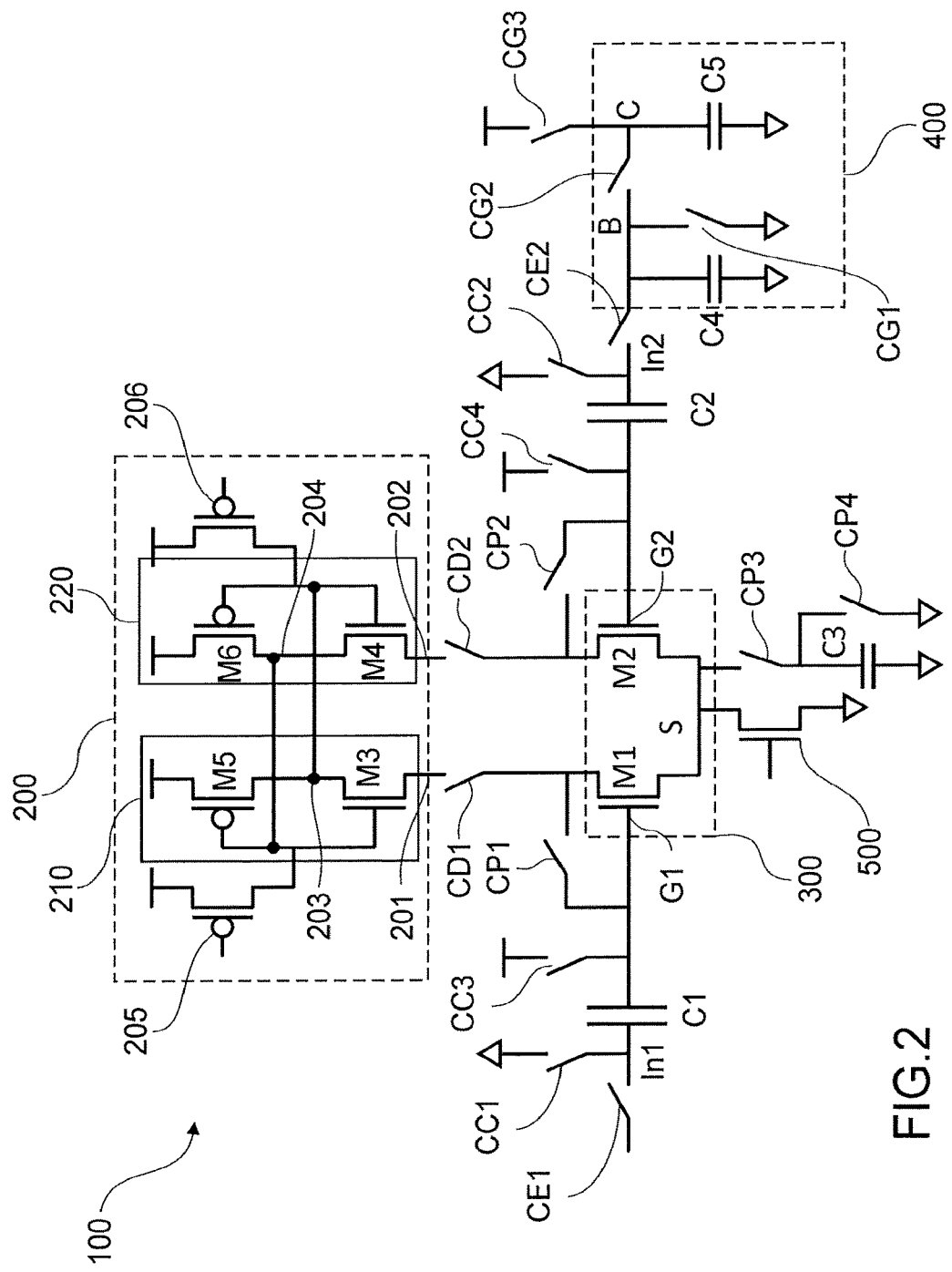
FIG. 2 is a schematic representation of a compensated comparator according to one embodiment of the present invention, in particular the decision stage, which is only given as an example, is that of a dynamic comparator.

In the case as represented in FIG. 2 where a capacitor C3 (with the associated switches CP3 and CP4) is used, the voltage Vsf is non-zero and is advantageously chosen (by relative dimensioning of the capacitors C3 and C1/C2) such that the aforementioned voltages Vg1$s$ and Vg2$s$ are significantly greater than the threshold voltages Vth1 and Vth2 such that the transistors M1 and M2 are indeed conductive during the decision phase. This makes it possible to improve the comparison precision, as well as the rapidity of decision taking. It is thereby possible to carry out the decision taking rapidly and thereafter to reduce the dynamic consumption of the comparator. This embodiment is further particularly suited to the case where the voltages Vin1 and Vin2 are low, or even very low, and do not suffice on their own to indeed make conductive the transistors M1 and M2.

As described previously, during the decision phase, the first CP1 and second CP2 sharing switches as well as the charge switches CC1, CC2, CC3 and CC4 are non-conductive.

The result of this decision phase is the generation of a state, called final state, at the output terminal or terminals of the compensated comparator 100, corresponding to the nodes 203 and 204.

The final state on an output terminal can take two values called, respectively, high state and low state, which depends on the sign of the difference $V_{in1}-V_{in2}$.

The means implemented within the scope of the present invention, and in particular the pre-charge device MCi and the sharing device MPi consume little energy and only add very little consumption compared to the conventional dynamic logic comparator.

In particular, a compensated comparator, hereafter noted "test comparator", manufactured according to the 130 nm technology node and provided with capacitances C1 and C2 of 35 fF and a capacitance C3 of 600 fF only consumes 250 nW at 10 MHz.

The main advantage of the pre-charge MCi and sharing MPi devices is that they make it possible to compensate the technological variations of the transistors of the comparator, notably those of the transistors M1 and M2. The dispersion of the trip point of one comparator to the next is thereby greatly reduced.

According to one simulation executed on the test comparator, the solution provided by the present invention makes it possible to reduce the dispersion and to pass from 50 mV to 2.5 mV of dispersion (to ±3 σ), for a supply voltage of 1V.

Furthermore, in the case where the frequency of use of the comparator does not impose rapidly stringing together the 3 phases, it is possible to make last as long as possible the pre-charge step MCi (which has a very low consumption) and to carry out the sharing step MPi just before carrying out the decision step. Thus, the sharing step MPi which makes it possible to "memorise" the differential of threshold voltages Vth1/Vth2 in the capacitors C1 and C2 could memorise the "present" conditions of variations due to the ageing of the components, temperature, etc., and not only due to the initial dispersions of the manufacturing method.

Moreover, the compensated comparator 100 may also comprise a reference voltage generator 400 to deliver the second input potential $V_{in2}$.

According to one embodiment, the generator 400 comprises a fourth capacitor C4 placed between earth and a node B as well as a fifth capacitor C5 placed between earth and a point C. A switch CG1 is placed in parallel with the capacitor C4, between the node B and earth. A switch CG2 is placed between the node B and the point C. A switch CG3 is placed between the point C and the supply voltage Vdd. The switch CE2 is placed between the terminal B and the input In2.

The generator 400 is for example commanded by the control circuit to:
during the pre-charge phase, isolate the two capacitors C4, C5 by making CG2 non-conductive, then charging the capacitor C5 to the supply voltage Vdd by switching on the switch CG3, and discharging the capacitor C4, by making the switch CG1 conductive;
during the sharing phase, isolate the capacitor C5 from the voltage source Vdd (by making the switch CG3 non-conductive), then making the switch CG1 non-conductive and carrying out a sharing of the charges between C4 and C5 by making the switch CG2 conductive;
at the end of the charge sharing, the potential at the level of terminal B corresponds to the reference potential that it is wished to apply as voltage $V_{in2}$;
during the decision phase, isolate the capacitor C5 if it is wished to be able to begin to recharge C5 to the voltage Vdd and impose the reference potential present on the capacitor C4 on the input In2.

An advantage of the reference voltage generator described above is that it is realised according to the principles of dynamic logic with minimum consumption. In the applications for which the comparator is used to compare a signal, Vin1, with a reference voltage applied on Vin2, a comparator/generator assembly that is very low consumption could advantageously be realised.

Such an assembly may advantageously be used in an image sensor to carry out a measurement of the voltage value corresponding to a pixel by comparison with a reference voltage.

Other embodiments of the present invention may be envisaged. Among others, other comparator set-ups may be used, the invention not being limited to the example of dynamic logic comparator described previously. For example, the decision stage may correspond to a simple resistive charge, each of the nodes 201 and 202 then being connected to a resistance furthermore connected to the supply voltage Vdd. Other types of charge may be envisaged to integrate for example filtering functions or other power consumption limiting functions. Moreover, the activation stage connected to the source of the transistors M1 and M2 is obviously adapted to the type of charge chosen to realise the decision stage, as is well known to those skilled in the art. For example, in the case where two resistances are used for the decision stage, a current source may be placed between the node S of the stage 300 and earth.

Furthermore, those skilled in the art will readily be able to realise the circuits described previously in complementary logic, using p-type transistors for the differential stage.

REFERENCES

[1] Miyahara, M & Asada, Yusuke & Paik, Daehwa & Matsuzawa, Akira. (2008), "A low-noise self-calibrating dynamic comparator for high-speed ADCs"; 269-272, 10.1109/ASSCC.2008.4708780.
[2] Cui, Ji & Tani, Sadahiro & Ohara, Kenji & Hirai, Yusaku & Matsuoka, Toshimasa. (2015), "A dynamic latched comparator with built-in offset calibration", Far East Journal of Electronics and Communications. 14. 105-115. 10.17654/FJECJun2015_105_115.

The invention claimed is:

1. A compensated comparator, comprising:
first and second inputs configured to receive, respectively, first ($V_{in1}$) and second ($V_{in2}$) input potentials to be compared;
a differential stage provided with first and second transistors of a same type, connected by sources thereof in a node (S) and respectively comprising a first gate and a second gate;
a decision stage connected to drains of the first and second transistors and delivering a comparison signal on an output of the comparator;
first and second capacitors intercalated, respectively, between the first gate and the first input and between the second gate and the second input;
first and second decision switches disposed between the decision stage and the drains of the first and second transistors of the differential stage; and
pre-charge, sharing, and decision devices commanded by a control circuit, configured to implement successive pre-charge, sharing, and decision phases,
the pre-charge device being configured to impose a charge on the first and second capacitors such that a pre-charge voltage is present at terminals of the capacitors at an end of the pre-charge phase,
the sharing device being configured to short circuit a gate and a drain of each of the first and second transistors, the short circuit causing a charge transfer from the first and second capacitors to the node (S), the charge transfer being interrupted from a moment that gate-source voltages of the first and second transistors become lower than respective threshold voltages of the first and second transistors, and
the decision device being configured to switch on the decision switches and to make a comparison between the first ($V_{in1}$) and second ($V_{in2}$) input potentials applied on the first and second inputs.

2. The compensated comparator according to claim 1, wherein the pre-charge device comprises first and second charge switches connecting the first and second inputs to an earth potential when made conductive on command of a first pre-charge signal, and further comprises third and fourth charge switches connecting the first and second gates to a supply voltage when made conductive on command of a second pre-charge signal, the first and second pre-charge signals being concomitant.

3. The compensated comparator according to claim 2, wherein the sharing device comprises first and second sharing switches commanded and configured to short circuit the gate and the drain of said each of the first and second transistors on command of a sharing signal, the third and fourth charge switches being non-conductive during the sharing phase.

4. The compensated comparator according to claim 3, wherein the decision device comprises first and second input switches commanded and configured to apply the first ($V_{in1}$) and second ($V_{in2}$) input potentials on the first and second inputs on command of a decision signal, said decision signal also commanding a closing of the first and second decision switches to enable passage of a current through the differential stage and the decision stage, the sharing switches and the charge switches being non-conductive during the decision phase.

5. The compensated comparator according to claim 1, wherein the decision stage and the differential stage are placed in series between an earth and a supply voltage, the node (S) of the differential stage being connected to earth, either directly or through an activation transistor, the activation transistor being made conductive during the decision phase.

6. The compensated comparator according to claim 5, wherein the node (S) of the differential stage is connected to earth through an activation transistor, and
wherein a third capacitor is disposed between earth and a third sharing switch furthermore connected to the node (S), a reset switch being disposed in parallel with the third capacitor, the third capacitor being discharged by making the reset switch conductive during the pre-charge phase, and the third capacitor being connected to the node (S) by making the third sharing switch conductive during the sharing phase.

7. The compensated comparator according to claim 5, wherein the activation transistor is made conductive during the sharing phase to enable transfer of charges from the first and second gates to the node (S).

8. The compensated comparator according to claim 1, further comprising first and second input switches respectively connected to the first and second inputs and commanded to be made conductive during the decision phase.

9. The compensated comparator according to claim 1, further comprising a reference voltage generator configured to impose the second input potential ($V_{in2}$).

10. The compensated comparator according to claim 9, wherein the reference voltage generator comprises a fourth capacitor disposed between earth and a node (B) as well as a fifth capacitor disposed between earth and a point (C), a switch being disposed in parallel with the fourth capacitor between the node (B) and earth, a switch being disposed between the node (B) and the point (C), a switch being disposed between the point (C) and a supply voltage (Vdd), a switch being disposed between the node (B) and the input (In2), the switches being commanded to:
during the pre-charge phase, charge the capacitors to the supply voltage Vdd and discharge the capacitors,
during the sharing phase, share the charges between the capacitors, to obtain a reference voltage at the terminals of the capacitors, and
during the decision phase, make the switches conductive to apply the reference voltage on the second input.

11. The compensated comparator according to claim 1, wherein the comparator is a dynamic logic comparator.

12. The compensated comparator according to claim 11, wherein the decision stage comprises a first inverter and a second inverter, mounted in counter-reaction.

13. The compensated comparator according to claim 12, wherein sources of NMOS transistors of the first and second inverters are connected, respectively, to the drains of the first and second transistors.

14. An imager comprising at least one compensated comparator according to claim 1.

* * * * *